(12) United States Patent
Matsumoto

(10) Patent No.: US 7,109,057 B2
(45) Date of Patent: Sep. 19, 2006

(54) SEALING APPARATUS FOR SEMICONDUCTOR WAFER AND METHOD OF MANUFACTURING SEMICONDUCTOR DEVICE BY USING SEALING APPARATUS

(75) Inventor: Jiro Matsumoto, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 344 days.

(21) Appl. No.: 10/202,024

(22) Filed: Jul. 25, 2002

(65) Prior Publication Data

US 2003/0022418 A1 Jan. 30, 2003

(30) Foreign Application Priority Data

Jul. 27, 2001 (JP) ............................... 2001-227945

(51) Int. Cl.
*H01L 21/66* (2006.01)
*H01L 21/00* (2006.01)
*H01L 21/44* (2006.01)
*H01L 29/40* (2006.01)

(52) U.S. Cl. ...................... 438/106; 438/15; 438/25; 438/26; 438/51; 438/55; 438/69; 438/112; 438/124; 438/126; 438/127; 257/787

(58) Field of Classification Search ................ 458/15, 458/25, 26, 51, 55, 64, 106, 112, 124, 126, 458/127; 257/787

See application file for complete search history.

(56) References Cited

U.S. PATENT DOCUMENTS

| 4,983,110 | A  | * | 1/1991  | Yoshida et al. ............. 425/116 |
| 5,302,850 | A  | * | 4/1994  | Hara .......................... 257/667 |
| 5,304,512 | A  | * | 4/1994  | Arai et al. .................... 29/827 |
| 6,344,162 | B1 | * | 2/2002  | Miyajima .............. 264/272.14 |
| 6,570,261 | B1 | * | 5/2003  | Farquhar et al. ............ 257/778 |
| 6,630,374 | B1 | * | 10/2003 | Yamamoto .................. 438/124 |
| 6,717,297 | B1 | * | 4/2004  | Sadarangani et al. ......... 310/14 |
| 2001/0042913 | A1 | * | 11/2001 | Fukuda et al. .............. 257/697 |

FOREIGN PATENT DOCUMENTS

| JP | 404177845   | * | 6/1992 |
| JP | 07022451    | * | 1/1995 |
| JP | P2001-47459 | A |  2/2001 |

* cited by examiner

*Primary Examiner*—Carl Whitehead, Jr.
*Assistant Examiner*—James M. Mitchell
(74) *Attorney, Agent, or Firm*—Junichi Mimura

(57) ABSTRACT

A sealing apparatus for a semiconductor wafer includes an upper mold and a lower mold. The lower mold includes a recess in which the semiconductor wader is placed, and a pot for introducing resin to the recess. The pot is located under a center area of the recess. Thus, when the resin is introduced in the recess, the resin is spread from the center area of the semiconductor wafer toward the peripheral area.

26 Claims, 6 Drawing Sheets

SEALING APPARATUS FOR SEMICONDUCTOR WAFER AND METHOD OF MANUFACTURING SEMICONDUCTOR DEVICE BY USING SEALING APPARATUS

CROSS-REFERENCE TO RELATED APPLICATION

This application claims the priority benefit of Japanese Patent Application No. 2001-227945, filed Jul. 27, 2001, the entire disclosure of which is incorporated herein by reference.

BACKGROUND OF THE INVENTION

1. Field of the Invention

The invention relates to a sealing apparatus for a semiconductor wafer, and a method of manufacturing a semiconductor device by using the sealing apparatus. More particularly, the invention relates to a method of manufacturing a Chip Size Package (CSP) whose size is similar to that of a semiconductor chip contained therein by using the sealing device.

2. Description of the Related Art

Recently, it has been required to shrink electric devices. To meet the requirement, it is also required to downsize a semiconductor device. As one of the solutions to satisfy these requirements, it has been proposed to form a semiconductor device having a chip size package (CSP) structure. The size of the semiconductor device having the CSP structure is almost the same as that of the semiconductor chip.

The method of forming the semiconductor device having the CSP structure includes a step for forming a plurality of semiconductor elements on a semiconductor wafer, a step for setting the semiconductor wafer in a mold, a step for sealing a surface of the semiconductor wafer on which the semiconductor elements are formed by a thermoset resin, a step for removing the semiconductor wafer sealed by the resin from the mold, a step for polishing the resin on the semiconductor wafer until electrodes formed on each of the circuit elements are exposed, and a step for dividing the semiconductor wafer into semiconductor devices having the CSP structure. If necessary, external terminals, such as soldering balls, may be formed on the exposed electrodes. Specifically, in the step for sealing a surface of the semiconductor wafer on which the semiconductor elements are formed by the thermoset resin, the thermoset resin is introduced on the surface of the semiconductor wafer from one side, and is expanded on the entire surface of the semiconductor wafer However, according to the process for manufacturing the CSP-type semiconductor device described above, since the thermoset resin is introduced on the surface of the semiconductor wafer from one side, and is expanded on the entire surface of the semiconductor wafer, it takes a time to spread the thermoset resin on the entire surface of the semiconductor wafer. Although the thermoset resin is melted by heat, the melted resin is re-solidified with the course of time. Thus, it is necessary to spread the thermoset resin on the semiconductor wafer from one side to the other side before the melted resin is solidified so that it is required to accelerate the flowing speed of the resin. On the other hand, there are many sensitive semiconductor elements formed on the surface of the semiconductor wafer where the resin covers. Thus, if the melted resin flows on the surface of the semiconductor wafer with high speed, the resin catches air near these elements. As a result, void is created in the resin.

SUMMARY OF THE INVENTION

An objective of the invention is to resolve the above-described problem and to provide a sealing apparatus for a semiconductor wafer having an upper mold and a lower mold, the lower mold including a recess and a pot, which is for receiving a solid resin, formed under the recess, the pot being located at the center of the recess.

The objective is achieved by a method of manufacturing a semiconductor device having preparing a sealing apparatus having an upper mold and a lower mold, the lower mold including a recess and a resin introduction part formed under the recess, and the resin introduction part being located at the center of the recess, putting a solid resin into the resin introduction part, placing a semiconductor wafer having a main surface on which a circuit element is formed, in a cavity which is formed by the recess when the upper and lower molds are closed, wherein the resin introduction part is located under the center of the main surface of the semiconductor wafer, melting the solid resin, and introducing the melted resin into the cavity, sealing the main surface of the semiconductor wafer by the melted resin, and dividing the resin sealed semiconductor wafer into semiconductor devices.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1A:
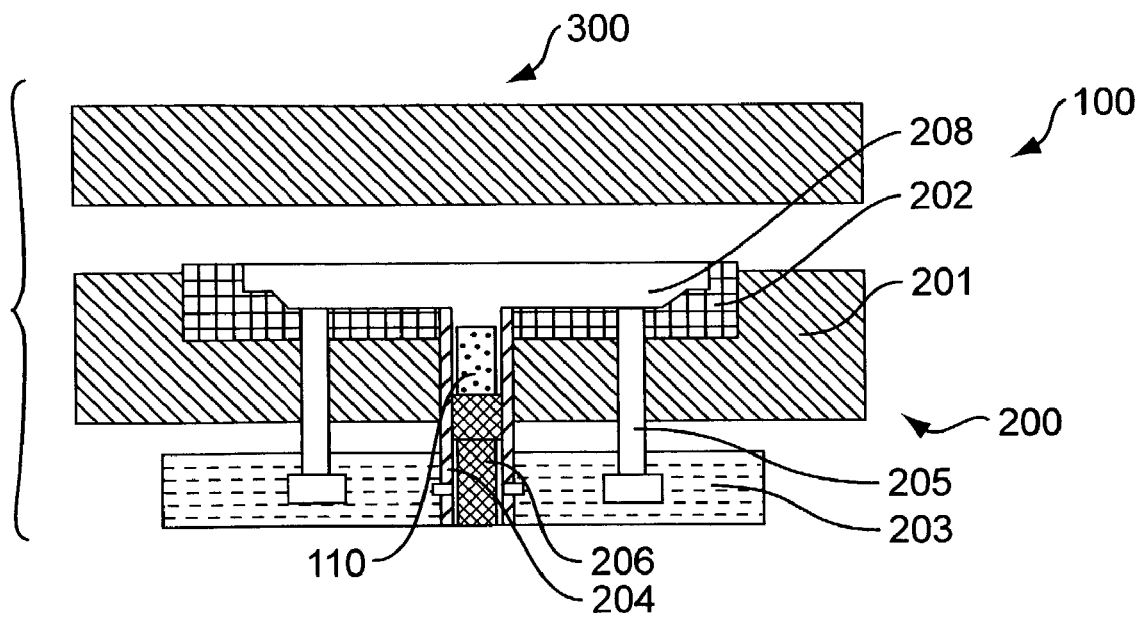
FIGS. 1A and 1B are sectional views of a sealing apparatus in a process of manufacturing the semiconductor device of the invention.

Referring to FIG. 1, a sealing apparatus 100 includes an upper mold 300 and a lower mold 200. The lower mold 200 includes a chase 201, a cavity block 202, an ejector plate 203, a pot 204, elector pins 205, and a plunger 206. The upper and lower molds 300, 200 are disposed vertically and are facing to each other. The cavity block 202 includes a recess 208, which will be a cavity when the upper and lower molds 300, 200 are closed. The recess 208 has a top part and a bottom part. The top part of the recess 208 is slightly larger than the bottom part. Thus, there is a step in the recess 208. The shape of the recess 208 is similar to the semiconductor wafer. The top part is also slightly larger than the semiconductor wafer and the bottom part is slightly smaller than the semiconductor wafer. Thus, the semiconductor wafer is hung at the step in the recess 208.

The pot 204 and the ejector pins 205 are formed under the bottom part of the recess 208, and go through the cavity block 202 and chase 201. The pot 204 is located at the center of the bottom part of the recess 208. The pot 204 is cylinder-shaped.

The cavity block 202 is fixed on the chase 201. The pot 204 and ejector pins 205 are fixed to the ejector plate 203. The pot 204 and ejector pins 205 can be slid in the chase 201 and the cavity block 202 vertically. That is, since the pot 204 and ejector pins 205 are fixed to the ejector plate 203, when the lower mold 200 moves toward the ejector plate 203, the tip of the pot 204 and the tip of the ejector pins 205 can be projected from the bottom surface of the recess 208.

The plunger 206 is located in the pot 204. At the beginning of the sealing process, the plunger 206 is disposed in a position, which is lower than the bottom of the recess 208. Thus, in the pot 204, a room is created between the plunger 206 and the recess 208.

As illustrated in FIG. 1A, a solid thermoset resin tablet 110 is placed in the room of the pot 204, which is formed between the plunger 206 and the recess 208 initially. The solid resin tablet 110 is cylinder-shaped. The diameter of the solid resin tablet 110, which is a little smaller than that of the pot 204, is used. As described before, the pot 204 is formed in the lower mold 200. Thus, the solid resin tablet 110 can be set in the room easily by dropping in the pot 204.

If the pot 204 is formed in the upper mold 300, it is necessary to use the solid resin tablet 110 having the same diameter as the pot 204. When such a solid resin tablet 110 is inserted in the pot 204, the solid resin tablet 110 can be held in the pot 204 by a coefficient of friction. However, if the diameter of the tablet 110 is manufactured larger than that of the pot 204 by accident, it is very difficult to insert the tablet 110 into the pot 204. If the diameter of the tablet 110 is manufactured smaller than that of the pot 204 by accident, the tablet 110 can not be held in the pot 204. Further, if the tip of the tablet 110 is projected from the surface of the upper mold 300, which faces to the semiconductor wafer, the circuit elements formed on a main surface of the semiconductor wafer may be damaged by the tablet 110 when the upper and lower mold 300, 200 are closed.

For the reasons above, it is preferable that the pot 204 be formed under the recess 208, and that the solid resin tablet 110 having the diameter, which is smaller than that of the pot 204, be used. In other words, it is preferable that the solid resin tablet 110 be placed in the room in the pot 204 by using gravity.

Figure 1B:
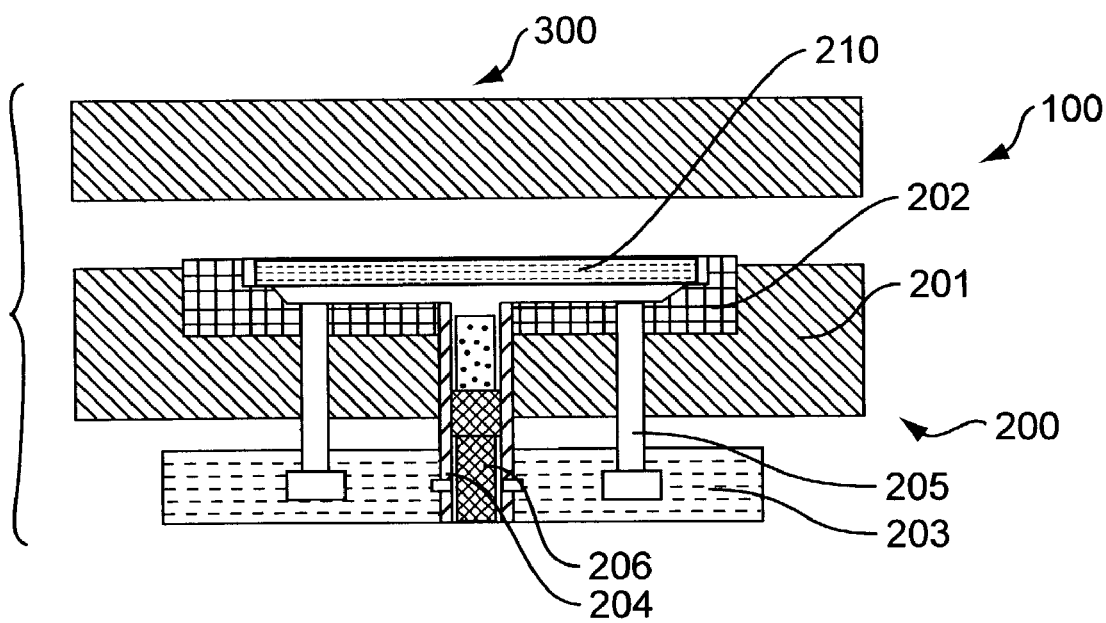

Next, referring FIG. 1B, a semiconductor wafer 210 is placed in the recess 208 of the cavity block 202. As described above, the circuit elements are formed on the main surface of the semiconductor wafer 210. In the recess 208, the main surface of the semiconductor wafer 210 faces down toward the pot 204. As described above, there is the step in the recess. Thus, the semiconductor wafer 210 is held at its periphery on the step. Therefore, although the top part of the recess is occupied by the semiconductor wafer 210, the bottom part of the recess 208 (which is now a cavity) is still empty.

Figure 6:
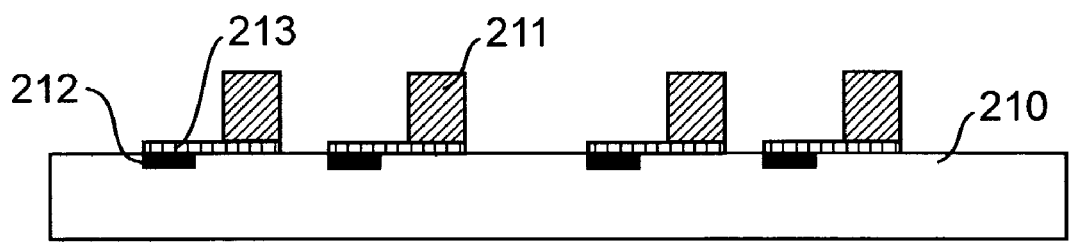
FIG. 6 is an enlarged cross sectional view of the semiconductor wafer before the resin material is formed thereon.

As illustrated in FIG. 6, conductive posts 211 are formed on the main surface of the semiconductor wafer 210. The conductive posts 211 are electrically connected to the circuit elements formed on the semiconductor wafer via pad electrodes 212 and conductive patterns 213 formed of copper.

Figure 2A:
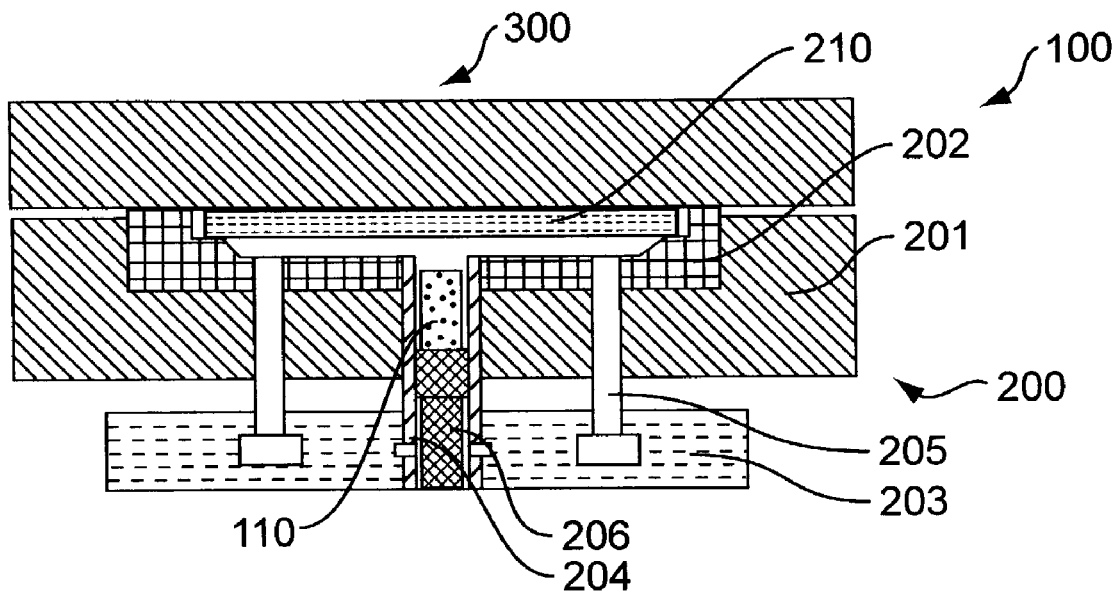
FIGS. 2A and 2B are sectional views of the sealing apparatus in the process following FIG. 1B.

Next, referring to FIG. 2A, by moving the lower mold up, the semiconductor wafer 210 is sandwiched by the upper and lower mold 300, 200. The upper mold 300 is fixed, and cannot be moved. In this step, an entire back surface of the semiconductor wafer 210, which is the opposite to the main surface, is substantially touched to the upper mold 300. The periphery of the main surface of the semiconductor wafer 210 is touched to the cavity block 202 (the step formed in the recess 208) formed in the lower mold 200. Under this state, the sealing apparatus 100 is heated upto a certain temperature, such as 170° C. so that the resin tablet 110 is melted.

Figure 2B:
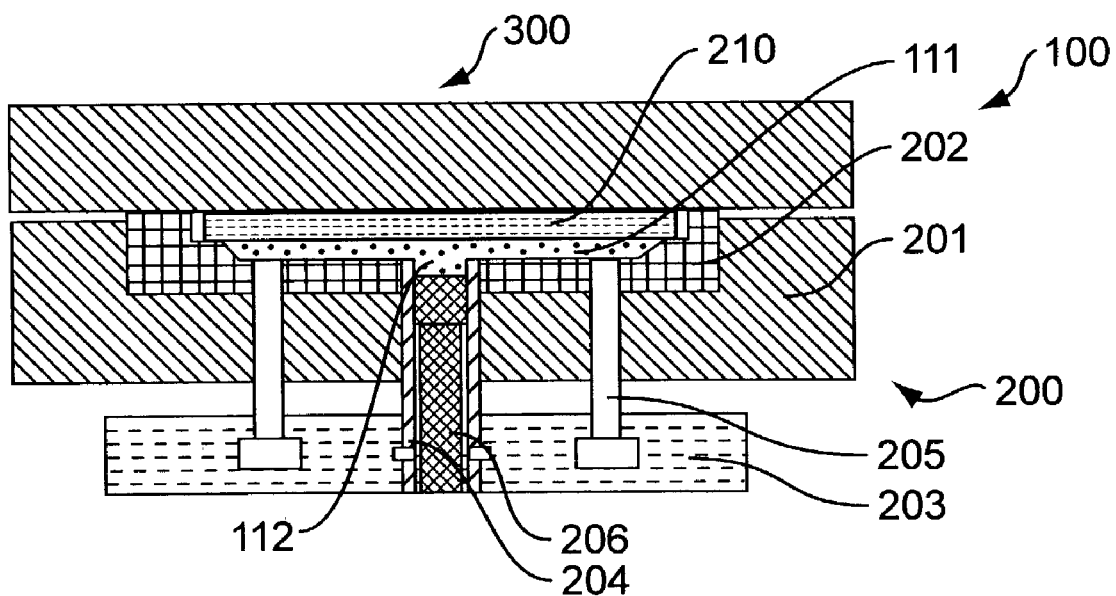

Then, referring to FIG. 2B, the plunger 206 is move up in order to introduce the melted resin 111 into the cavity of the recess 208. Thus, the main surface of the semiconductor wafer 210 is filled with the melted resin 111. After the main surface of the semiconductor wafer 210 is filled with the melted resin 111, the plunger 206 maintains to apply a certain pressure to the melted resin 111. The melted resin 111 is re-solidified with the course of time. Thus, the plunger 206 maintains to apply a certain pressure to the melted resin 111 for a certain period for solidifying the melted resin 111.

By applying heat, the thermoset resin becomes fluid because its viscosity declines. When the melted resin is continued to be heated for a certain time, the melted resin is re-solidified because its viscosity increases. Although, the time period that the melted resin is re-solidified depends on a kind of resin, the melted resin is re-solidified within a few seconds, generally. Thus, the melted resin should be spread on the entire main surface of the semiconductor wafer 210 within a few seconds while the viscosity of the resin declines.

Since the pot 204 is located at the center of the bottom of the recess 208, the melted resin 111 is introduced on the semiconductor wafer 210 from its center area toward its peripheral area. Thus, a distance that the melted resin flows is the same as a radius of the semiconductor wafer 210. On the other hand, if the melted resin is introduced from the peripheral area of the semiconductor wafer 210, a distance that the melted resin flows is the same as a diameter of the semiconductor wafer 210. Thus, comparing to the method that the melted resin is introduced from the peripheral area of the semiconductor wafer 210, the distance that the melted resin flows is half in the method that the melted resin 111 is introduced on the semiconductor wafer 210 from its center area toward its peripheral area. Thus, according to the invention, since the melted resin 111 is introduced on the semiconductor wafer 210 from its center area toward its peripheral area, the time that the semiconductor wafer 210 is filled with the melted resin on its surface can be half in comparison with the method that the melted resin is introduced from the peripheral area of the semiconductor wafer 210. Thus, the melted resin can be spread on the entire main surface of the semiconductor 210 within a few second, Further, since the melted resin 111 is spread from the center area of the semiconductor wafer 210 to the peripheral area, the melted resin 111 can be spread on the entire main surface of the semiconductor 210 evenly.

As described with reference to FIG. 6, there are many conductive posts 211 formed on the main surface. If the flowing speed of the melted resin is accelerated, the resin catches air near the conductive posts 211. As a result, void is created in the resin 111. According to the invention, the melted resin 111 is introduced from the center area of the semiconductor wafer 210 to the peripheral area, it is not necessary to accelerate the flow speed of the melted resin 111. Thus, it is possible to avoid forming the void in the resin.

As illustrated in FIG. 2B, after the main surface of the semiconductor wafer 210 is sealed by the resin 111, a projected resin 112 is formed in an area corresponding to the pod 204. This is the result that the resin tablet 110 having volume larger than the capacity of the cavity, is used. Essentially, it is preferred not to form the projected resin 112. Thus, it is preferred to use the resin tablet 110 having volume, which equals the capacity of the cavity. However, if the volume of the resin tablet 110 is less than the capacity of the bottom part of the recess 208, the plunger may reach the surface of the semiconductor wafer 210. As a result, the circuit element formed on the main surface may be damaged. To avoid the problem, the resin tablet 110 having volume larger than the capacity of the bottom part of the recess 208 is used. As a result, the projection resin 112 is formed.

Figure 3A:
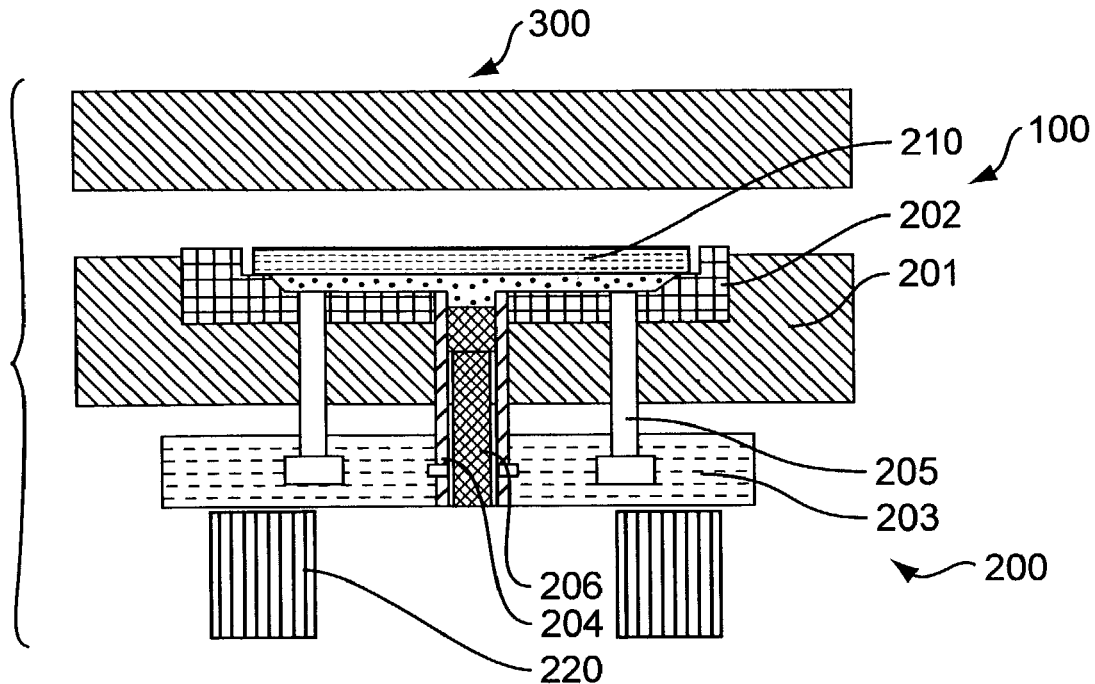
FIGS. 3A and 3B are sectional views of the sealing apparatus in the process following FIG. 2B.
Figure 3B:
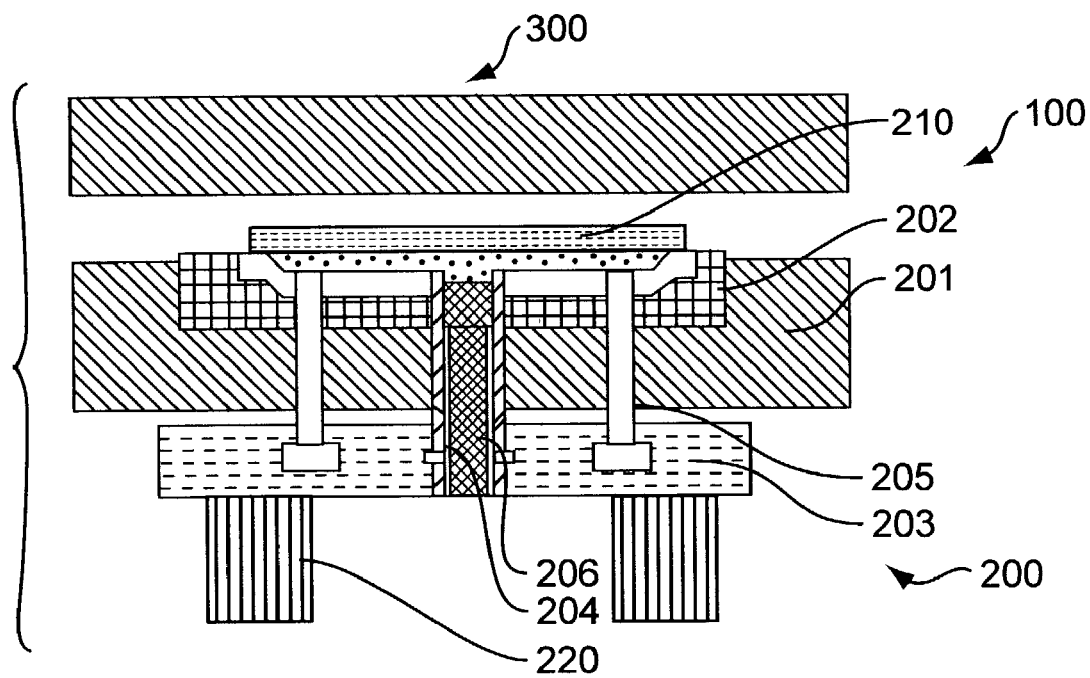

Next, referring to FIG. 3A, the lower mold 200 moves down. Thus, the semiconductor wafer 210 also moves down with the movement of the lower mold 200. As a result, the back surface of the semiconductor wafer 210 is separated from the upper mold 300. When the lower mold 200 moves down for a certain distance, the ejector plate 203 reaches an ejector lot 220. After the ejector plate 203 reaches the ejector lot 220, the lower mold 200 further moves down. Since there is a space between the chase 201 and the ejector lot 203, the chase 201 and the cavity block 202 can further moves down. However, since the ejector plate 203 reaches ejector lot 220, the ejector plate 203 cannot move further down. Further, as shown in FIG. 3B, since the ejector pins 205 and the pot 204 are fixed to the ejector plate 203, the tips of both of the ejector pins 205 and the pot 204 are projected from the cavity block 202 when the lower mold 200 further moves down. Also, the plunger 206 in the pot 204 is moved as well.

Since the pot 204 and the ejector pins 205 are fixed to the single ejector plate 203, the pot 204 and the ejector pins 205 has a same movement. As a result, the resin sealed semiconductor wafer 210 is pushed up by the pot 204 and the ejector pins 205 with good balance.

Figure 4:
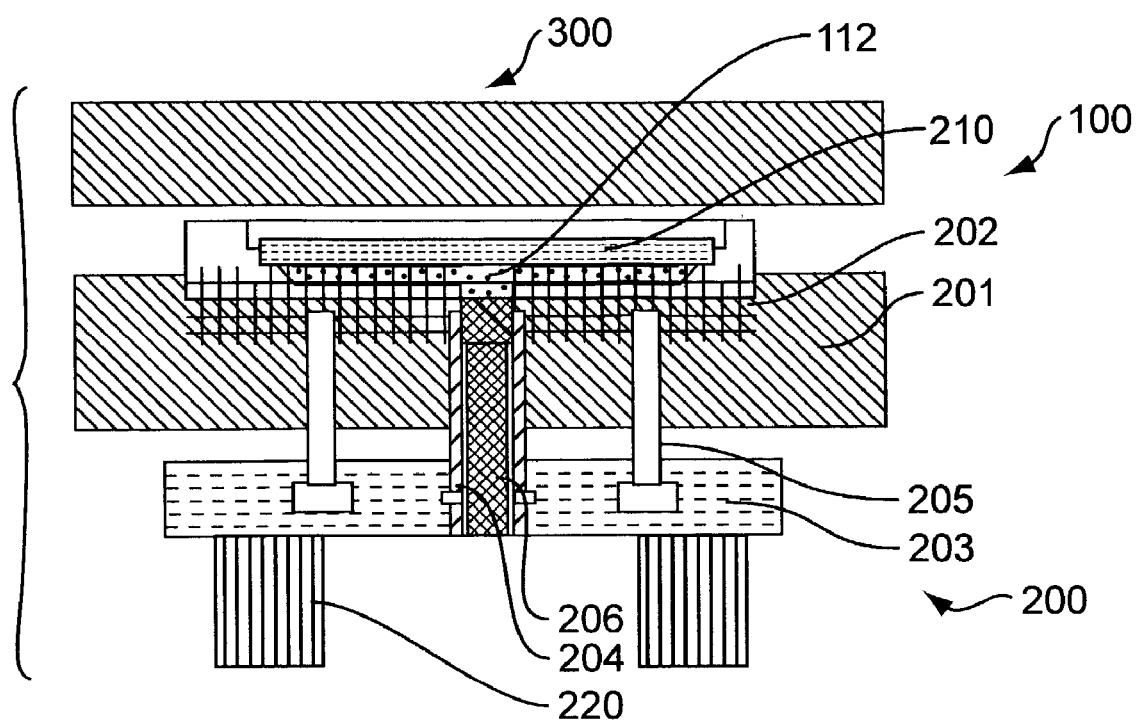
FIG. 4 is a sectional views of the sealing apparatus in the process following FIG. 3B

Next, referring to FIG. 4, the lower mold 200 moves up. There is an unillustrated spring between the chase 201 and the ejector plate 203. When the lower mold 200 moves up, a gap can be formed between the chase 201 and the ejector plate 203 by the spring. Thus, the projected pot 204 and the projected ejector pins 205 return to the original position. That is, the pot 204 and the ejector pins 205 move back in the cavity block 202. However, the plunger 206 remains its position. Therefore, the projected resin 112, which is formed on the main surface of the semiconductor wafer 210, is pushed out from the pot 204. Under this state, the resin sealed semiconductor wafer 210 can be removed from the sealing apparatus 100.

Figure 5A:
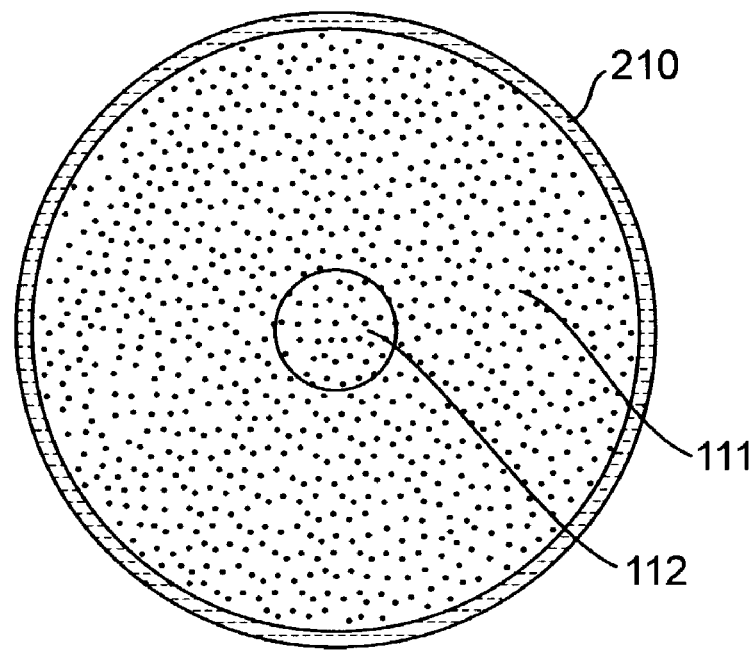
FIG. 5A is a plane view of a resin sealed semiconductor wafer.
Figure 5B:
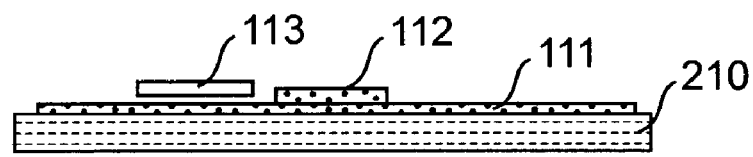
FIG. 5B is a cross sectional view of the resin sealed semiconductor wafer illustrated in FIG. 5A.
Figure 7A:
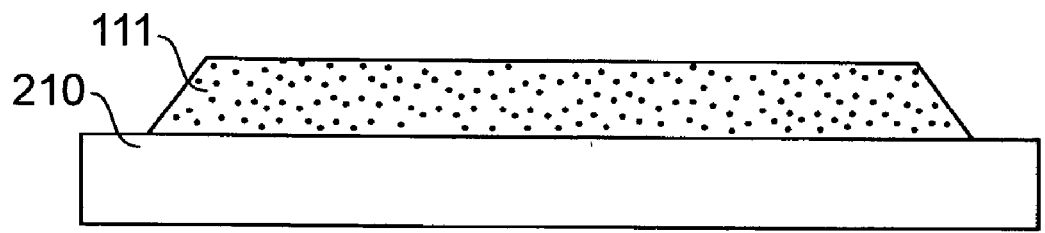
FIGS. 7A through 7D is cross sectional views of manufacturing a semiconductor device from the resin sealed semiconductor wafer.

Next, a method of forming a semiconductor device from the resin sealed semiconductor wafer 210 is explained below with reference to FIGS. 5A, 5B, 7A through 7D. As shown in FIG. 5A, on the main surface of the semiconductor wafer 210, the resin 111 is formed. In the center area of the semiconductor wafer 210, the projected resin 112 is formed. The first step is to remove the projected resin 112. As shown in FIG. 5B, the projected resin can be cut by a circle-shaped blade 113. By removing the projected resin 112, the surface of the resin can be the plane as shown in FIG. 7A.

Figure 7B:
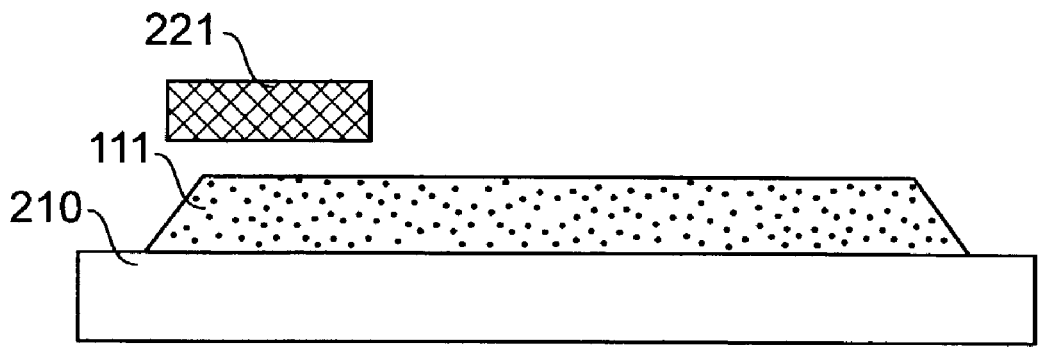

Next, as shown in FIG. 7B, the plane surface of the resin 111 is polished by a polisher 221 until the conductive posts 211, which is formed on the main surface of the semiconductor wafer 210, are exposed. The projected resin 112 can be removed by the polisher 221. If the projected resin 112 is removed by the polisher 221 in advance to polish the surface of the resin 111, it is prefer to polish the projected resin 112 with speed higher than that for polishing the surface of the resin 111. As described above, the plane surface of the resin 111 is polished by the polisher 221 until the conductive posts 211. If the plane surface of the resin 111 is over-polished by the polisher 221, the thickness of the resin 111 thins down. Thus, it is preferable that the plane surface of the resin 111 is polished with a relatively slow speed. However, since the projected resin 112 should be removed completely, it is preferable that the projected resin 112 is polished with a relatively high speed to increase the TAT. Thus, it is prefer to polish the projected resin 112 with speed higher than that for polishing the surface of the resin 111. When the projected resin 112 is removed by cutting its root with the circle-shaped blade 113 as described above, it is possible to remove the projected resin 112 faster than polishing.

Figure 7C:
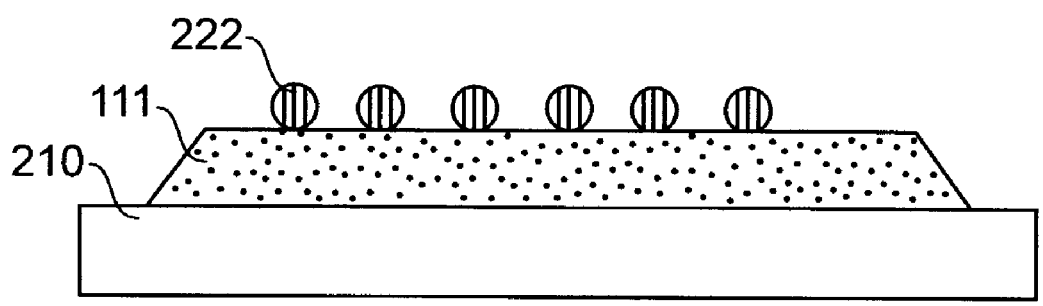
Figure 7D:
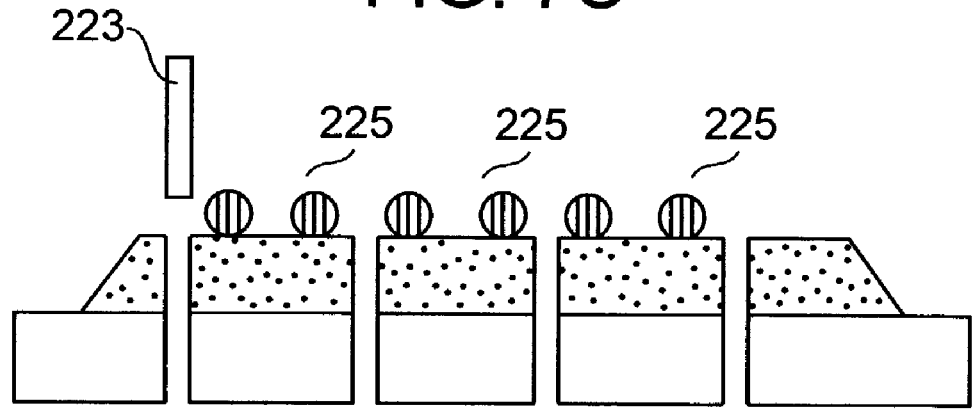

After that, a ball electrode 222 is formed on each exposed conductive post 211 as shown in FIG. 7C. Then, as shown in FIG. 7D, the semiconductor wafer 210 is separated into individual semiconductor devices 225 by using a dicing blade 223. This individual semiconductor device 225 whose surface is sealed by resin is call a Chip Size Package semiconductor device.

According to the invention, to seal the main surface of the semiconductor wafer 210 by resin material 111, the melted resin 111 is introduced on the semiconductor wafer 210 from its center area toward its peripheral area, the time that the semiconductor wafer 210 is filled with the melted resin 111 on its surface can be half in comparison with the method that the melted resin is introduced from the peripheral area of the semiconductor wafer 210. Thus, it is not necessary to accelerate the resin flow speed. As a result, it is possible to avoid creating the void in the resin 111. Further, according to the invention, since the pot 204 is formed in the lower mold 200, it is easy to put the resin tablet 110 in the pot 204.

While the invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A method of forming a semiconductor device, comprising:
preparing a sealing apparatus having an upper mold and a lower mold, the lower mold including a recess and a resin introduction part formed at a center of a bottom surface of the recess;
putting a solid resin into the resin introduction part;
placing a semiconductor wafer having a main surface on which a circuit element is formed, in a cavity which is formed in the recess when the upper and lower molds are closed, wherein the main surface includes a center area and a peripheral area, which surrounds the center area, and wherein the resin introduction part faces the center of the main surface of the semiconductor wafer or its neighborhood;
melting the solid resin, and introducing the melted resin into the cavity;
sealing the main surface of the semiconductor wafer by flowing the melted resin from the center area to the peripheral area; and
dividing the resin sealed semiconductor wafer into semiconductor devices.

2. A method of forming a semiconductor device as claimed in claim 1, wherein an entire back surface, which is the opposite to the main surface, is substantially touched to the upper mold while the main surface is sealed by the melted resin.

3. A method of forming a semiconductor device as claimed in claim 2, wherein the semiconductor wafer is sandwiched at its periphery by the upper and lower molds while the main surface is sealed by the melted resin.

4. A method of forming a semiconductor device as claimed in claim 3, wherein the resin introduction part includes a pot, which is moveable in the lower mold, and the lower mold further includes an ejector pin, which is moveable in the lower mold, further including:
   separating the semiconductor wafer from the upper mold by moving the lower mold after sealing the main surface of the semiconductor wafer by the melted resin; and
   separating the semiconductor wafer from the lower mold by pushing the semiconductor wafer with the pot and ejector pin.

5. A method of forming a semiconductor device as claimed in claim 3, wherein the sealing apparatus includes ejector lot, which is disposed under the lower mold, the resin introduction part includes a pot, which is moveable in the lower mold, and the lower mold further includes an ejector pin, which is moveable in the lower mold, and an ejector plate wherein the ejector pin and the pot are fixed to the ejector plate, further including:
   separating the semiconductor wafer from the upper mold by moving the lower mold after sealing the main surface of the semiconductor wafer by the melted resin; and
   separating the semiconductor wafer from the lower mold by further moving the lower mold until the ejector plate reaches the elector lot,
   whereby the pot and ejector pin are projected from the lower mold.

6. A method of forming a semiconductor device as claimed in claim 2, wherein the resin introduction part includes a pot, which is moveable in the lower mold, and the lower mold further includes an ejector pin, which is moveable in the lower mold, further including:
   separating the semiconductor wafer from the upper mold by moving the lower mold after sealing the main surface of the semiconductor wafer by the melted resin; and
   separating the semiconductor wafer from the lower mold by pushing the semiconductor wafer with the pot and ejector pin.

7. A method of forming a semiconductor device as claimed in claim 2, wherein the sealing apparatus includes ejector lot, which is disposed under the lower mold, the resin introduction part includes a pot, which is moveable in the lower mold, and the lower mold further includes an ejector pin, which is moveable in the lower mold, and an ejector plate wherein the ejector pin and the pot are fixed to the ejector plate, further including:
   separating the semiconductor wafer from the upper mold by moving the lower mold after sealing the main surface of the semiconductor wafer by the melted resin; and
   separating the semiconductor wafer from the lower mold by further moving the lower mold until the ejector plate reaches the elector lot,
   whereby the pot and ejector pin are projected from the lower mold.

8. A method of forming a semiconductor device as claimed in claim 1, wherein the semiconductor wafer is sandwiched at its periphery by the upper and lower molds while the main surface is sealed by the melted resin.

9. A method of forming a semiconductor device as claimed in claim 8, wherein the resin introduction part includes a pot, which is moveable in the lower mold, and the lower mold further includes an ejector pin, which is moveable in the lower mold, further including:
   separating the semiconductor wafer from the upper mold by moving the lower mold after sealing the main surface of the semiconductor wafer by the melted resin; and
   separating the semiconductor wafer from the lower mold by pushing the semiconductor wafer with the pot and ejector pin.

10. A method of forming a semiconductor device as claimed in claim 8, wherein the sealing apparatus includes ejector lot, which is disposed under the lower mold, the resin introduction part includes a pot, which is moveable in the lower mold, and the lower mold further includes an ejector pin, which is moveable in the lower mold, and an ejector plate wherein the ejector pin and the pot are fixed to the ejector plate, further including:
    separating the semiconductor wafer from the upper mold by moving the lower mold after sealing the main surface of the semiconductor wafer by the melted resin; and
    separating the semiconductor wafer from the lower mold by further moving the lower mold until the ejector plate reaches the elector lot,
    whereby the pot and ejector pin are projected from the lower mold.

11. A method of forming a semiconductor device as claimed in claim 1 wherein a projection resin is formed in an area corresponding to the resin introduction part while the main surface is sealed by the melted resin, further comprising:
    removing the projection resin before dividing the resin sealed semiconductor wafer into semiconductor devices.

12. A method of forming a semiconductor device as claimed in claim 11, wherein the resin introduction part includes a pot, which is moveable in the lower mold, and the lower mold further includes an ejector pin, which is moveable in the lower mold, further including:
    separating the semiconductor wafer from the upper mold by moving the lower mold after sealing the main surface of the semiconductor wafer by the melted resin; and
    separating the semiconductor wafer from the lower mold by pushing the semiconductor wafer with the pot and ejector pin.

13. A method of forming a semiconductor device as claimed in claim 11, wherein the sealing apparatus includes ejector lot, which is disposed under the lower mold, the resin introduction part includes a pot, which is moveable in the lower mold, and the lower mold further includes an ejector pin, which is moveable in the lower mold, and an ejector plate wherein the ejector pin and the pot are fixed to the ejector plate, further including:
    separating the semiconductor wafer from the upper mold by moving the lower mold after sealing the main surface of the semiconductor wafer by the melted resin; and separating the semiconductor wafer from the lower mold by further moving the lower mold until the ejector plate reaches the elector lot, whereby the pot and ejector pin are projected from the lower mold.

14. A method of forming a semiconductor device as claimed in claim 11, wherein removing the projection resin includes removing the projection part by polishing, further including:

polishing the resin formed on the main surface of the semiconductor wafer, wherein a speed of polishing the projection part is faster than that of polishing the resin formed the main surface of the semiconductor wafer.

15. A method of forming a semiconductor device as claimed in claim 1, wherein the resin introduction part includes a pot, which is moveable in the lower mold, and the lower mold further includes an ejector pin, which is moveable in the lower mold, further including:

separating the semiconductor wafer from the upper mold by moving the lower mold after sealing the main surface of the semiconductor wafer by the melted resin; and separating the semiconductor wafer from the lower mold by pushing the semiconductor wafer with the pot and ejector pin.

16. A method of forming a semiconductor device as claimed in claim 1, wherein the sealing apparatus includes ejector lot, which is disposed under the lower mold, the resin introduction part includes a pot, which is moveable in the lower mold, and the lower mold further includes an ejector pin, which is moveable in the lower mold, and an ejector plate wherein the ejector pin and the pot are fixed to the ejector plate, further including:

separating the semiconductor wafer from the upper mold by moving the lower mold after sealing the main surface of the semiconductor wafer by the melted resin; and separating the semiconductor wafer from the lower mold by further moving the lower mold until the ejector plate reaches the elector lot, whereby the pot and ejector pin are projected from the lower mold.

17. A method of forming a semiconductor device, comprising:

preparing a sealing apparatus having an upper mold and an lower mold, the lower mold including a recess and a pot formed at a center of a bottom surface of the;

putting a solid resin tablet into the pot;

placing a semiconductor wafer having a main surface on which a circuit element is formed, in a cavity which is formed in the recess when the upper and lower molds are closed, wherein the main surface includes a center area and a peripheral area, which surrounds the center area, and wherein the center area of the main surface faces to the pod;

sandwiching the semiconductor wafer by the upper and lower mold, wherein the entire back surface, which is the opposite to the main surface, is substantially touched to the upper mold; and melting the solid resin tablet, and introducing the melted resin into the cavity, whereby the main surface of the semiconductor wafer is sealed by flowing the melted resin from the center area to the peripheral area.

18. A method of forming a semiconductor device as claimed in claim 17, further comprising, applying a constant pressure to the melted resin until the melted resin is solidified after introducing the melted resin into the cavity.

19. A method of forming a semiconductor device as claimed in claim 18, wherein the pot is moveable in the lower mold, and the lower mold further includes an ejector pin, which is moveable in the lower mold, and which faces to the main surface of the semiconductor wafer, further including:

separating the semiconductor wafer from the lower mold by pushing the semiconductor wafer with the pot and ejector pin.

20. A method of forming a semiconductor device, comprising:

preparing a sealing apparatus having an upper mold and a lower mold, the lower mold including a recess and a resin introduction part, wherein the recess has a center area and a peripheral area, and the resin introduction part is located at the center area of the recess;

putting a solid resin into the resin introduction part;

placing a semiconductor wafer having a main surface on which a circuit element is formed, in a cavity which is formed in the recess when the upper and lower molds are closed, wherein the main surface includes a center area and a peripheral area, which surrounds the center area, and wherein the resin introduction part faces the center of the main surface of the semiconductor wafer or its neighborhood;

melting the solid resin, and introducing the melted resin into the cavity;

sealing the main surface of the semiconductor wafer by flowing the melted resin from the center area to the peripheral area; and dividing the resin sealed semiconductor wafer into semiconductor devices.

21. A method of forming a semiconductor device as claimed in claim 20 wherein a projection resin is formed in an area corresponding to the resin introduction part while the main surface is sealed by the melted resin, further comprising:

removing the projection resin before dividing the resin sealed semiconductor wafer into semiconductor devices.

22. A method of forming a semiconductor device as claimed in claim 21, wherein the resin introduction part includes a pot, which is moveable in the lower mold, and the lower mold further includes an ejector pin, which is moveable in the lower mold, further including:

separating the semiconductor wafer from the upper mold by moving the lower mold after sealing the main surface of the semiconductor wafer by the melted resin; and separating the semiconductor wafer from the lower mold by pushing the semiconductor wafer with the pot and ejector pin.

23. A method of forming a semiconductor device as claimed in claim 21, wherein the sealing apparatus includes ejector lot, which is disposed under the lower mold, the resin introduction part includes a pot, which is moveable in the lower mold, and the lower mold further includes an ejector pin, which is moveable in the lower mold, and an ejector plate wherein the ejector pin and the pot are fixed to the ejector plate, further including:

separating the semiconductor wafer from the upper mold by moving the lower mold after sealing the main surface of the semiconductor wafer by the melted resin; and separating the semiconductor wafer from the lower mold by further moving the lower mold until the ejector plate reaches the elector lot, whereby the pot and ejector pin are projected from the lower mold.

24. A method of forming a semiconductor device as claimed in claim 21, wherein removing the projection resin includes removing the projection part by polishing, further including:

polishing the resin formed on the main surface of the semiconductor wafer, wherein a speed of polishing the projection part is faster than that of polishing the resin formed the main surface of the semiconductor wafer.

25. A method of forming a semiconductor device as claimed in claim 20, further comprising, applying a constant pressure to the melted resin until the melted resin is solidified after introducing the melted resin into the cavity.

26. A method of forming a semiconductor device as claimed in claim 25, wherein the pot is moveable in the lower mold, and the lower mold further includes an ejector pin, which is moveable in the lower mold, and which faces to the main surface of the semiconductor wafer, further including:

separating the semiconductor wafer from the lower mold by pushing the semiconductor wafer with the pot and ejector pin.

* * * * *